United States Patent
Lytle et al.

(10) Patent No.: US 6,329,281 B1
(45) Date of Patent: Dec. 11, 2001

(54) METHODS FOR FABRICATING A MULTILEVEL INTERCONNECTION FOR AN INTEGRATED CIRCUIT DEVICE UTILIZING A SELECTIVE OVERLAYER

(75) Inventors: Steven Alan Lytle; Mary Drummond Roby, both of Orlando; Daniel Joseph Vitkavage, Winter Garden, all of FL (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/454,909

(22) Filed: Dec. 3, 1999

(51) Int. Cl.[7] .................................. H01L 21/4763
(52) U.S. Cl. .................. 438/624; 438/637; 438/638
(58) Field of Search .................... 438/622, 624, 438/637, 638, 640

(56) References Cited

U.S. PATENT DOCUMENTS

| | | | |
|---|---|---|---|
| 5,635,423 | * 6/1997 | Huang et al. | 438/624 |
| 5,822,996 | 3/1999 | Dai | 438/597 |
| 5,877,075 | 3/1999 | Dai et al. | 438/597 |
| 5,891,799 | 4/1999 | Tsui | 438/624 |
| 5,916,823 | 6/1999 | Lou et al. | 438/738 |
| 5,926,732 | * 7/1999 | Matsuura | 438/622 |
| 5,933,761 | 8/1999 | Lee | 438/783 |
| 5,935,762 | 8/1999 | Dai et al. | 430/312 |
| 5,939,788 | 8/1999 | McTeer | 257/751 |
| 6,025,259 | * 2/2000 | Yu et al. | 438/618 |
| 6,107,177 | * 8/2000 | Lu et al. | 438/597 |
| 6,107,191 | * 8/2000 | Han | 438/637 |

FOREIGN PATENT DOCUMENTS 6-97290-A * 4/1994 (JP) ..................... 438/624

* cited by examiner

Primary Examiner—T. N. Quach
(74) Attorney, Agent, or Firm—Alston & Bird LLP

(57) ABSTRACT

The present invention utilizes a selective overlayer to provide more efficient fabrication of a dual damascene multi-level interconnect structure. The selective overlayer serves as a protective mask which prevents the upper layer of the composite layer from being eroded during the formation of the multi-level interconnects. The present invention also solves some of the problems associated with the full-via first and partial-via first fabrication methods because the selective overlayer enables an efficient, deep partial via to be formed while preventing the deposit of undeveloped photoresist in subsequent fabrication steps. The present invention also provides advantages during the planarization and polishing of the dual damascene structure after the deposition of the conductive layer because the selective overlayer allows for efficient planarization without loss of trench depth control.

21 Claims, 13 Drawing Sheets

METHODS FOR FABRICATING A MULTILEVEL INTERCONNECTION FOR AN INTEGRATED CIRCUIT DEVICE UTILIZING A SELECTIVE OVERLAYER

FIELD OF THE INVENTION

The present invention relates to methods for fabricating a multi-level interconnection for an integrated circuit device, and more specifically, to methods for making a dual damascene contact.

BACKGROUND OF THE INVENTION

As the level of integration for integrated circuits increases, the number of interconnects necessary for linking up devices increases, too. Therefore, designs employing four or more metallic layers are gradually becoming the norm in the fabrication of integrated circuits. When the level of integration is further increased a high production yield and good reliability is difficult to achieve.

Damascene processing is a fabrication technique that involves the creation of interconnect lines by first etching a trench in a planar dielectric layer, and then filling that trench with a conductor. This is the preferred method for fabricating semiconductor devices with copper metal interconnects because copper is not easily patterned using conventional anisotropic etching techniques. Dual damascene is a multilevel interconnection process in which the filling of the trench and the contact or via openings, which form the connections to the previous interconnect level with metal, is done simultaneously.

Several fabrication schemes exist to form dual damascene structures. A common scheme is known as the full-via first method. FIGS. 1A–1D are cross-section views showing steps of a conventional full-via first dual damascene fabrication method. As shown in FIG. 1A, a semiconductor substrate 100 is provided having semiconductor devices 110 formed therein. A composite dielectric layer is then formed over the semiconductor substrate, wherein the composite dielectric layer comprises a barrier dielectric layer 120 of a first dielectric material, a via dielectric layer 130 of a second dielectric material, an etch stop dielectric layer 140 of a third dielectric material, and a trench dielectric layer 150 of a fourth dielectric material. A first patterned photoresist layer 160 is formed over the composite layer exposing a via opening 170. Using standard etching techniques, the via opening 170 is transferred through the trench dielectric layer 150, etch stop dielectric layer 140, and via dielectric layer 130 exposing the barrier dielectric layer 120. Next, referring to FIG. 1B, the first patterned photoresist layer is removed and a second patterned photoresist layer 180 is formed over the composite layer to define a trench opening 190.

Then, referring to FIG. 1C, the trench opening 190 is transferred through the trench dielectric layer 150, whereby the etch stop dielectric layer 140 prevents erosion of the via dielectric layer 130. Turning now to FIG. 1D, using the second patterned photoresist layer 180 as a mask, the trench opening 190 is then transferred through the etch stop dielectric layer 140 exposing the via dielectric layer 130, and the via opening 170 is transferred through the barrier dielectric layer 120 exposing a conductor 110 within the semiconductor substrate 100. A conductive layer (not shown) can then be formed over the entire structure, filling both the via and trench openings 170, 190. Thereafter, a polishing process can be performed to planarize the dual damascene structure.

The full-via first method is problematic because, for example, the initial via is relatively deep, has a high aspect ratio, and typically requires etching through three dielectric layers (e.g., the trench dielectric, etch stop dielectric, and via dielectric). Forming this deep via can be very slow and requires the etch process to have a high degree of profile control and excellent selectivity to the first patterned photoresist layer in order to provide suitable results. As used herein, selectivity is the etch rate of one dielectric material divided by the etch rate of a second dielectric material wherein a high degree of selectivity implies that the first dielectric etches much slower than the second dielectric. If the selectivity between the first patterned photoresist layer and the dielectric layers is not sufficiently high, the etching process will remove the first patterned photoresist layer and begin eroding the trench dielectric before the via is fully formed.

To overcome some of the difficulties associated with the full-via first method, a few of which are discussed above, an alternate scheme commonly referred to as the partial-via first method can be used. FIGS. 2A–2D are cross-sectional views illustrating steps of a conventional partial-via first fabrication method wherein the structural layers are substantially the same as those described above in connection with the full-via first method.

As shown in FIG. 2A, a first patterned photoresist layer 160 is formed over the trench dielectric layer 150 to define a via opening 170. Referring to FIG. 2B, the via opening 170 is transferred through the trench dielectric layer 150 and the etch stop dielectric layer 140 but, unlike the full-via first method, the via opening 170 is only partially transferred into the via dielectric layer 130. Turning to FIG. 2C, the first patterned photoresist layer is then removed and a second patterned photoresist layer 180 is formed to define a trench opening 190. Referring to FIG. 2D, the via opening 170 is then transferred through the via dielectric layer 130 exposing the barrier dielectric layer 120 while, at the same time, the trench opening 190 is transferred through the trench dielectric layer 150 exposing the etch stop dielectric layer 140. The dual damascene structure is then completed using substantially the same steps employed in the full-via first method.

The partial-via first method appears to eliminate some of the difficulties in the full-via first method by reducing the depth of the initial via etch, and thus decreasing the required level of selectivity between the first patterned photoresist layer and the dielectric layers. The partial-via first method may also decrease the time required to make the initial via etch. This method, however, may create additional problems. For example, one problem is that, as shown in FIG. 2C, after formation of the second patterned photoresist layer 180, undeveloped photoresist 200 may be left at the bottom of the partially etched via opening 170. The undeveloped photoresist 200 may form a barrier which prevents the via opening 170 from being completely transferred through the via dielectric layer 130 while the trench opening 190 is being transferred through the trench dielectric layer 150. The deeper the partial via opening is during the time of the formation of the second patterned photoresist layer, the more likely that undeveloped photoresist will be left in the via.

However, if the depth of the partial via opening is reduced to avoid leaving undeveloped photoresist in the via, then the time required to complete the via during the completion of the trench is increased, often resulting in the trench etch being completed prior to the completion of the via. As a result, the total time to complete the structure is increased, and the etch stop dielectric layer must have a very high degree of selectivity with respect to the via dielectric layer to prevent the trench opening from being transferred into the via dielectric layer.

Another problem with both the full-via first and partial-via first methods occurs during the polishing process after the conductive layer is deposited to fill the trench and via openings. A common process of planarizing the dual damascene structure and removing the excess conductive layer from above the trench dielectric layer is known as chemical/mechanical polishing (CMP). A critical problem with the CMP process, as well as other polishing methods, is that a limited degree of selectivity is obtainable between the conductive layer and the trench dielectric layer. Thus, the CMP process often erodes the upper portion of the trench dielectric layer and the upper portion of the conductive layer in the trench, causing poor trench depth control. Poor trench depth control translates into an uncontrolled interconnect resistance which reduces overall circuit performance.

Therefore, an unsatisfied need exists for methods of fabricating a dual damascene contact which prevents the formation of undeveloped photoresist and also does not allow undefined erosion of either the trench or via dielectrics. An unsatisfied need also exists for a fabrication method that allows for the planarization of the dual damascene structure without losing control over the depth of the trench.

SUMMARY OF THE INVENTION

The present invention comprises a method utilizing a selective overlayer for more efficient fabrication of a dual damascene multilevel interconnect structure. The selective overlayer serves as a protective mask which prevents the upper layer of the composite layer from being eroded during the formation of the multilevel interconnects. The present invention also solves the problems associated with the full-via first and partial-via first fabrication methods because the selective overlayer enables an efficient, deep partial via to be formed while preventing the deposit of undeveloped photoresist in the via during subsequent fabrication steps. The present invention also provides advantages during the planarization and polishing of the dual damascene structure after the deposition of the conductive layer because the selective overlayer allows for efficient planarization without loss of trench depth control.

In accordance with an aspect of the invention, a method of fabricating a multilevel conductive interconnection for an integrated circuit device is disclosed. This method comprises providing a semiconductor substrate including a semiconductor device and having a dielectric layer formed thereon. A selective overlayer is formed over the dielectric layer and a first patterned photoresist layer is formed over the selective overlayer to define a first opening. The selective overlayer and the dielectric layer are etched to a first predetermined depth using the first patterned photoresist layer as a mask to transfer the first opening through the selective overlayer and at least partially into the dielectric layer. The first patterned photoresist layer is removed and a second patterned photoresist layer is formed over the selective overlayer to define a second opening. The dielectric layer is etched to a second predetermined depth, which is greater than the first predetermined depth, using the selective overlayer as a mask to transfer the first opening further into the dielectric layer. The selective overlayer is etched using the second patterned photoresist layer as a mask to transfer the second opening through the selective overlayer. The dielectric layer is etched using the selective overlayer as a mask to transfer the first opening through the composite layer exposing the semiconductor substrate, and the second opening into the dielectric layer to a third predetermined depth which is less than the second predetermined depth.

In addition, the second patterned photoresist layer can be removed and a conductive layer can be deposited to fill the first and second openings. The conductive layer may then be polished and planarized using the selective overlayer as a polish slowdown.

In addition to the method described above, the dielectric layer may comprise a first dielectric layer comprising a first dielectric material formed over a second dielectric layer comprising a second dielectric material. In this structure, it is preferred that the first predetermined depth be chosen such that the first opening is transferred at least partially into the first dielectric layer and the second predetermined depth be chosen such that the first opening is transferred through the first dielectric layer and at least partially into the second dielectric layer. It is also preferred that the third predetermined depth be chosen such that second opening is transferred through the first dielectric layer exposing the second dielectric layer.

In accordance with another aspect of the invention, the dielectric layer may comprise a composite layer comprising a first dielectric layer, formed over a second dielectric layer, formed over a third dielectric layer, formed over a fourth dielectric layer. A selective overlayer is formed over the composite layer and a first patterned photoresist layer is formed over the selective overlayer to define a first opening. The selective overlayer and the composite layer are then etched to a first predetermined depth using the first patterned photoresist layer as a mask to transfer the first opening through the selective overlayer and at least partially into the composite layer. The first patterned photoresist layer is removed and a second patterned photoresist layer is formed over the selective overlayer to define a second opening. The composite layer is etched to a second predetermined depth which is greater than the first predetermined depth using the selective overlayer as a mask to transfer the first opening further into the composite layer while the selective overlayer prevents the second opening from being transferred into the first dielectric layer. The selective overlayer is then etched using the second patterned photoresist layer as a mask to transfer the second opening through the selective overlayer. The composite layer is then etched using the selective overlayer and the second dielectric layer as masks to transfer the first opening through the third dielectric layer and the second opening through the first dielectric layer. The composite layer is then etched to transfer the first opening through the fourth dielectric layer and the second opening through second dielectric layer.

In addition to the method described above, the second patterned photoresist layer may be removed and a conductive layer deposited to fill the first and second openings. The conductive layer may then be planarized and polished using the selective overlayer as a polish slowdown.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1A:
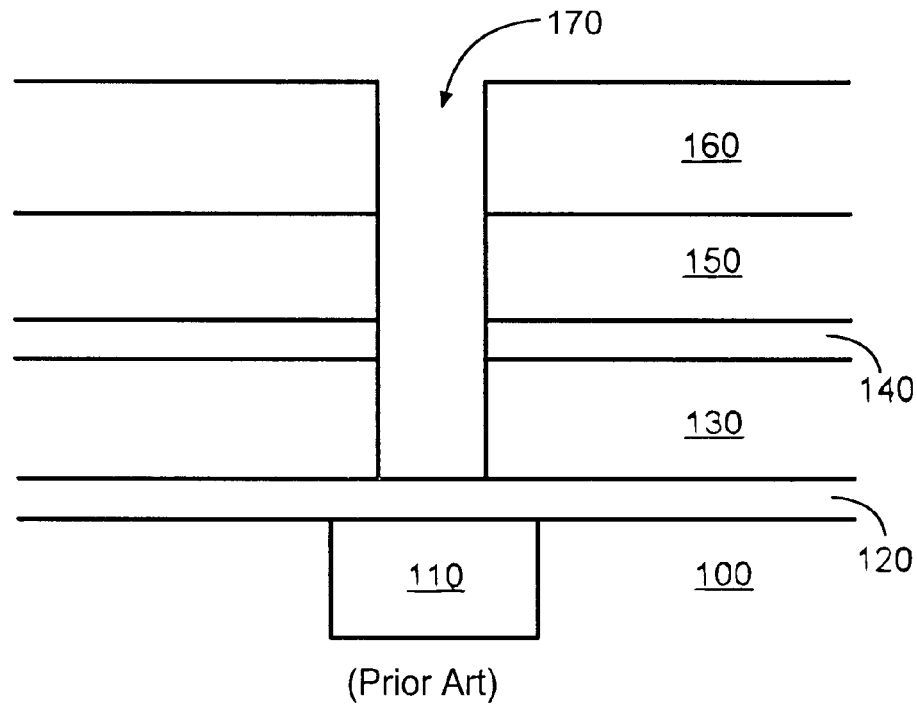
FIGS. 1A–1D (prior art) are cross-sectional views showing manufacturing steps of a conventional full-via first dual damascene processing method.
Figure 1B:
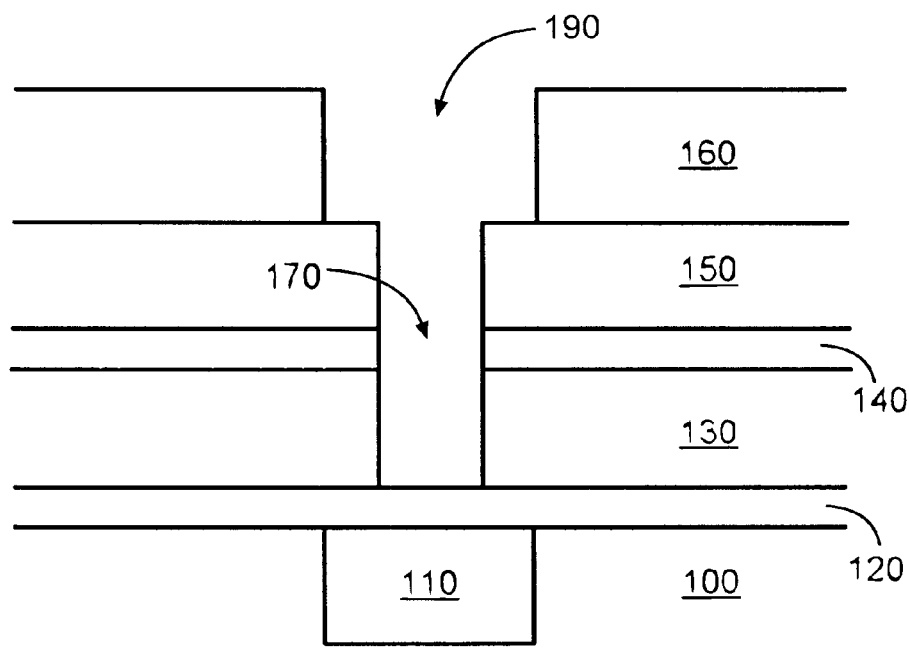
Figure 1C:
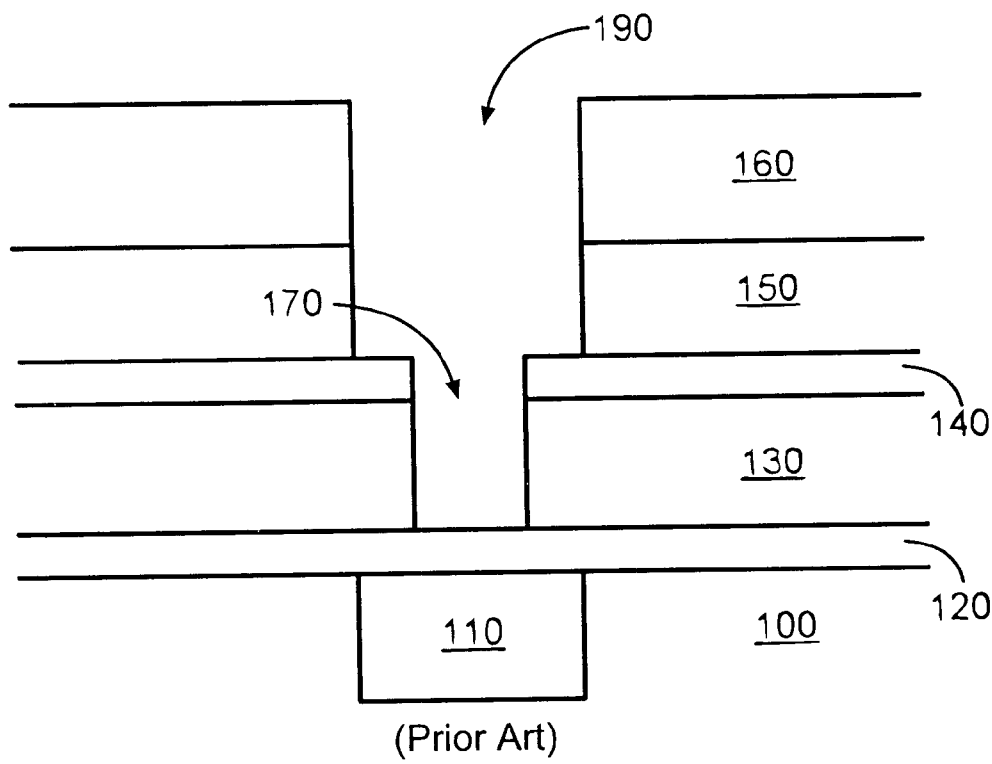
Figure 1D:
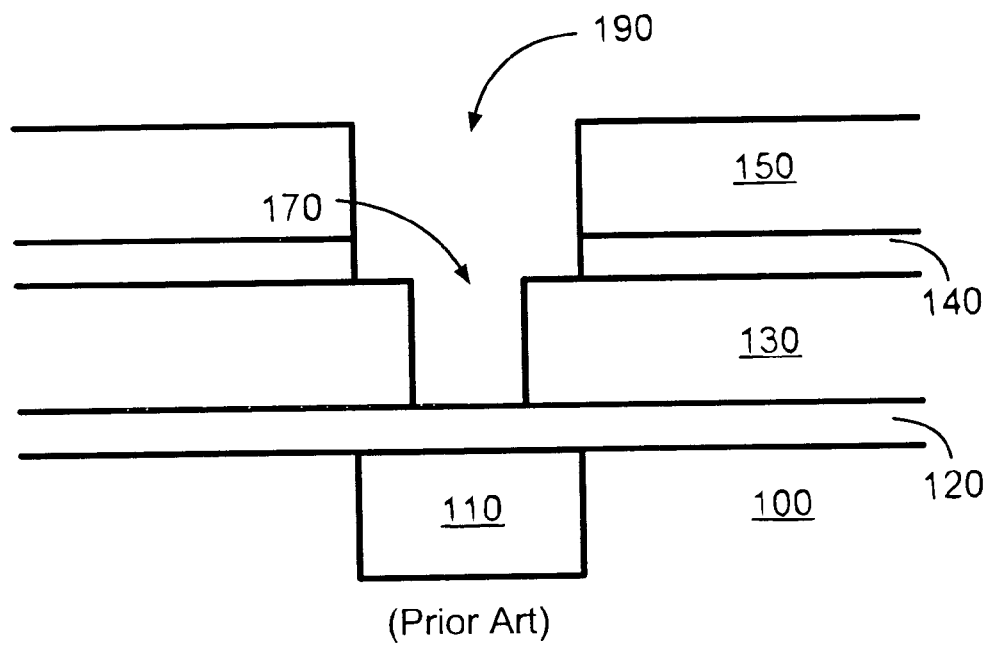
Figure 2A:
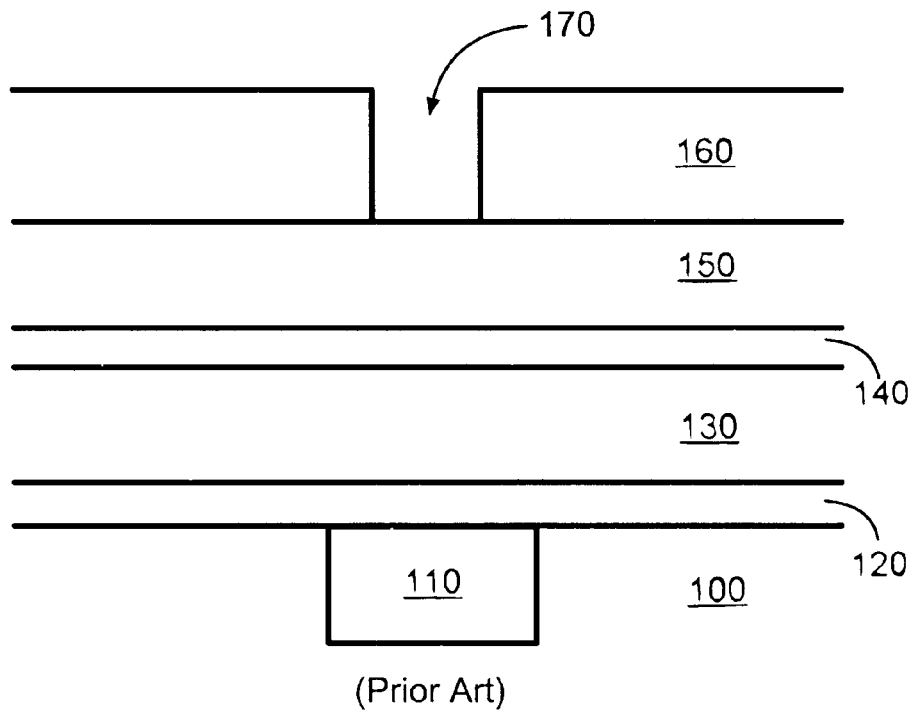
FIGS. 2A–2D (prior art) are cross-sectional views showing manufacturing steps of a conventional partial-via first dual damascene processing method.
Figure 2B:
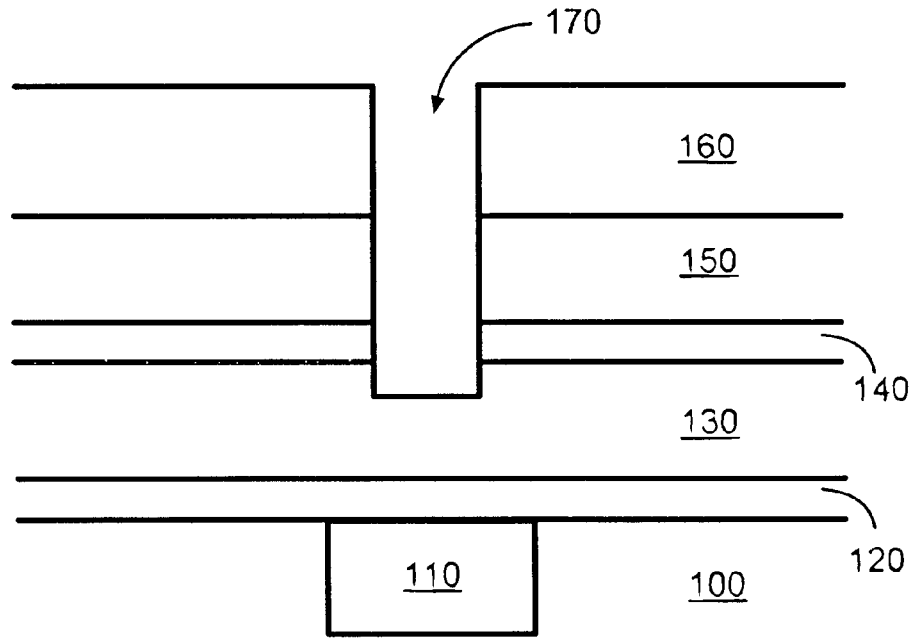
Figure 2C:
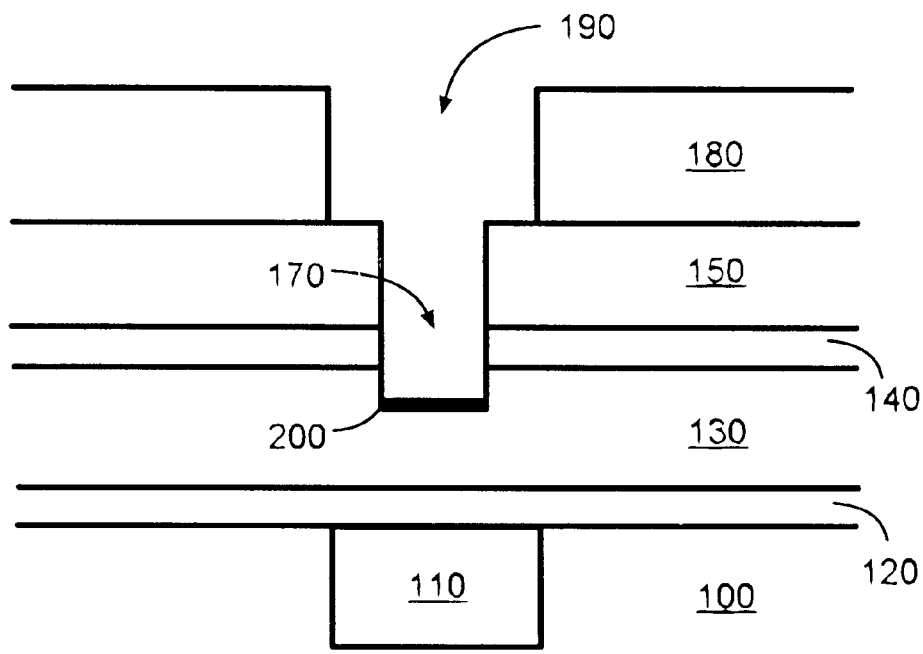
Figure 2D:
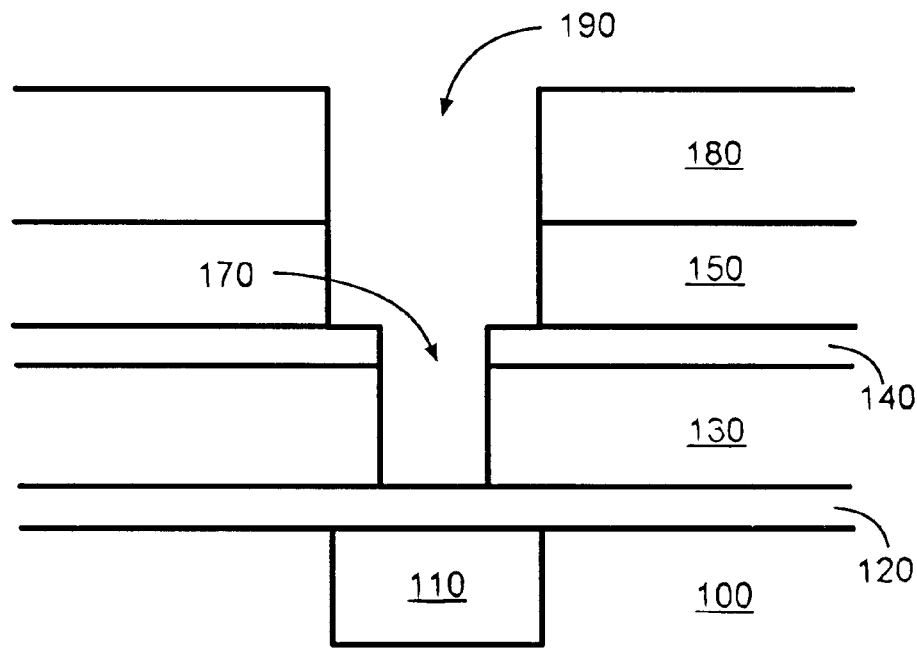
Figure 3A:
FIGS. 3A–3J are cross-sectional views showing manufacturing steps of a method for fabricating a multilevel conductive interconnection for an integrated circuit according to a first embodiment of the present invention.

Referring to FIGS. 3A–3J, there are shown cross-sectional views illustrating steps of a preferred embodiment of the present invention for fabricating a multi-level conductive interconnection for an integrated circuit device utilizing a selective overlayer. As shown in FIG. 3A, a semiconductor substrate 300 is provided having a dielectric layer 310 formed thereon. The term semiconductor substrate is understood to possibly include a semiconductor wafer, active and passive devices formed within the wafer, and layers formed on the wafer's surface. Thus, the term semiconductor substrate is meant to include devices formed within a semiconductor wafer and the layers overlying the wafer. The dielectric layer 310 may comprise one or more layers of dielectric material which may be formed using techniques well-known in the art such as plasma enhanced chemical vapor deposition (PECVD), chemical vapor deposition (CVD), or spin-on techniques.

Figure 3B:
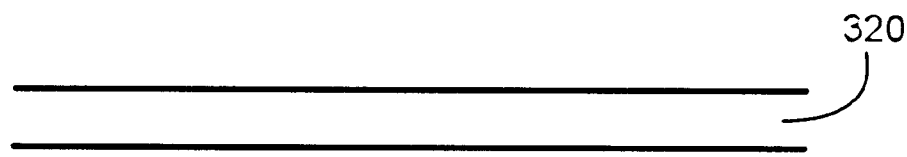
Figure 3B:

Turning now to FIG. 3B, a selective overlayer 320 is formed over the dielectric layer 310 in accordance with the present invention. The selective overlayer 320 may be formed using PECVD, CVD, spin-on methods, or any of several other techniques well-known in the art. The selective overlayer 320 may comprise any of several dielectric materials, for example, silicon nitride (SiN), amorphous hydrogenated silicon carbide (a—SiC:H), or silicon oxynitride (SiON). The selective overlayer material is chosen so that there exists a high degree of selectivity between the selective overlayer 320 and certain of the layers in the dielectric layer 310, depending, of course on the composition of the dielectric layer. The thickness of the selective overlayer 320 may vary depending on factors such as the composition of the dielectric layer 310 and the composition of the selective overlayer 320, but is typically between 5 and 150 nanometers.

The selective overlayer 320 provides numerous advantages over the prior art. First, the selective overlayer 320 serves as a protective layer that prevents the upper layer of the dielectric layer 310 from being eroded during the formation of the multilevel interconnects. Second, the selective overlayer 320 solves many of the problems associated with the full-via first and partial-via first methods because it allows a relatively deep partial via to be formed while preventing the deposit of undeveloped photoresist in subsequent steps. Third, the selective overlayer 320 provides advantages during the planarization and polishing processes because it may be chosen to have a high degree of selectivity with respect to the conductive layer allowing for planarization without loss of trench depth control. The selective overlayer 320 may be chosen to provide other advantages as well. For instance, the selective overlayer 320 may be selected so that it has desired optical properties to assist in photolithography processes by reducing the reflectivity of the underlying layers.

Figure 3C:
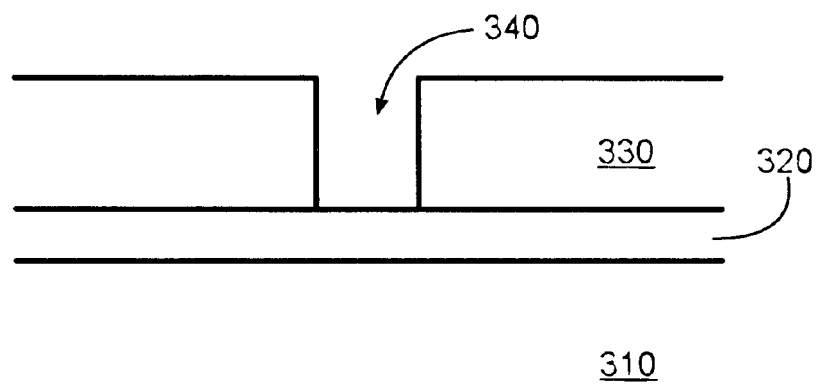
Figure 3C:
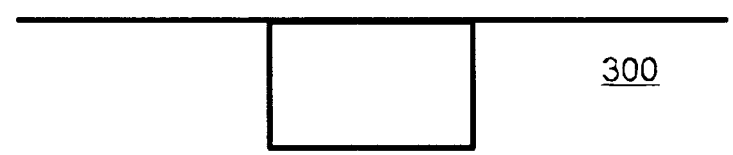

Referring now to FIG. 3C, a first patterned photoresist layer 330 is formed over the selective overlayer 320 to define a first opening 340. The dimensions of the first opening may vary widely in accordance with the overall circuit design. The first patterned photoresist layer may be formed using any of several well-known photolithography methods.

Figure 3D:
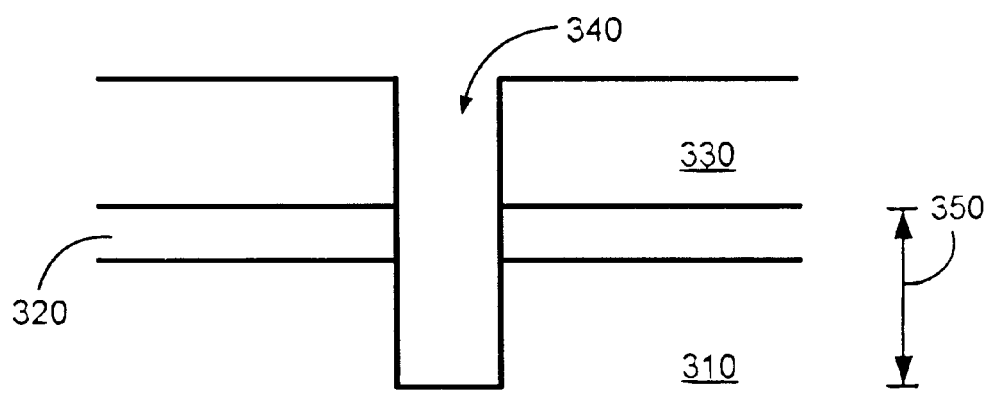
Figure 3D:
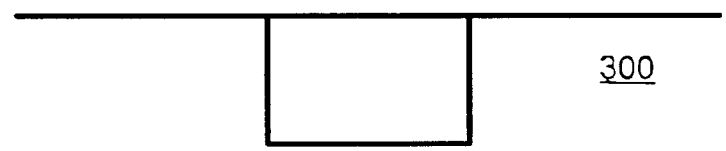

As shown in FIG. 3D, the selective overlayer 320 and the dielectric layer 310 are etched using the first patterned photoresist layer 330 as a mask to transfer the first opening 340 through the selective overlayer 320 and into the dielectric layer 310 to a first predetermined depth 350. The first predetermined depth 350 is chosen based on the composition of the dielectric layer 320 and the desired depth of the initial etch. It should, however, be shallow enough to completely develop the photoresist and, thus, preclude undeveloped photoresist from remaining in the bottom or lower portion of the first opening 340 during the subsequent step of forming a second patterned photoresist layer. The etching process may be accomplished using any one of several well-known etching techniques including reactive ion etching or high density plasma (HDP) etching. The etching chemistry preferably is chosen to minimize the time required to complete the etch. By way of example only, if the selective overlayer 320 is formed of SiN and the portion of the dielectric layer 310 being etched is formed of silicon dioxide ($SiO_2$), then a two step etching process may be utilized wherein the first step would etch through the selective overlayer using a suitable etching chemistry such as one comprising fluoromethane ($CH_3F$) and oxygen ($O_2$), and the second step would etch the dielectric layer to the first predetermined depth 350 using a suitable etching chemistry such as one comprising perfluorocyclobutane ($C_4F_8$), carbon monoxide (CO), argon (Ar) and $O_2$.

Figure 3E:
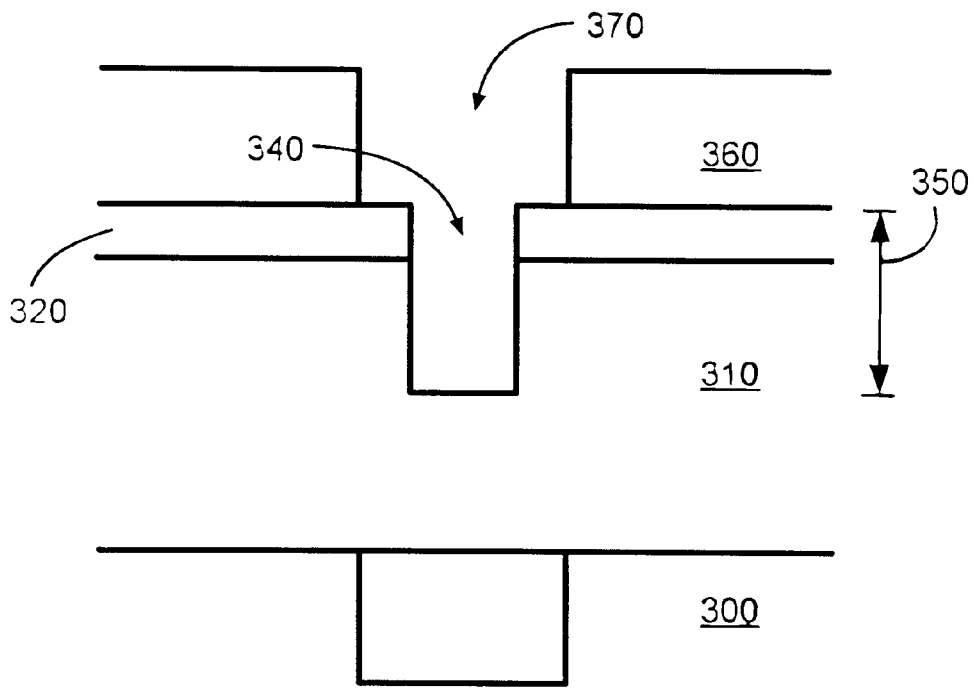

Turning to FIG. 3E, the first patterned photoresist layer is removed using any of several techniques well-known in the art such as oxygen plasma ashing or by applying a chemical solvent strip. A second patterned photoresist layer 360 is then formed over the selective overlayer 320 to define a second opening 370 using any of several well-known photolithography techniques. Although the second opening 370 is shown in FIG. 3E is wider than the first opening 340, it will be understood that the dimensions of the first and second openings 340, 370 are determined by the overall circuit design and, thus, the second opening need not be wider than the first opening.

Figure 3F:
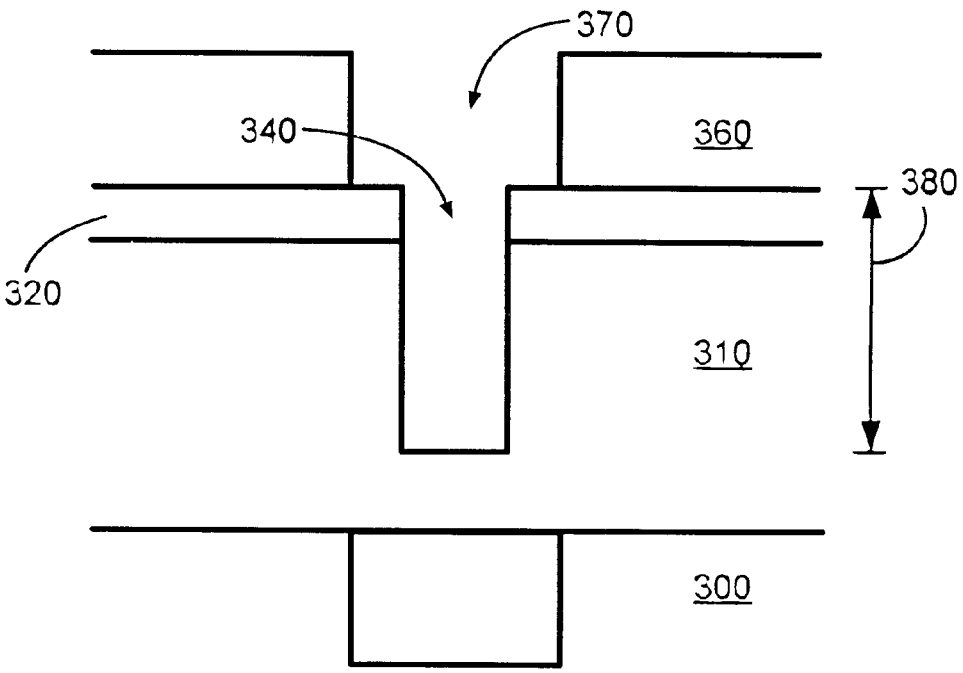

Referring to FIG. 3F, the dielectric layer 310 is etched to a second predetermined depth 380 using the selective overlayer 320 as a mask to transfer the first opening 340 further into the dielectric layer 310. Advantageously, the selective overlayer 320 prevents the second opening 370 from being transferred into the dielectric layer 310. This allows a relatively deep first opening 340 to be formed without eroding the upper surface of the dielectric layer 310 and eliminates the possibility that undesired undeveloped photoresist may remain at the bottom of the first opening because the depth of the first opening remained relatively shallow until after the second patterned photoresist layer had been formed.

The etching of the dielectric layer may be accomplished using any of several well-known techniques such as HDP or reactive ion etching. In accordance with the invention, the selective overlayer 320 should have a relatively high degree of selectivity with respect to the portion of the dielectric layer 310 being etched. This high degree of selectivity allows the dielectric layer 310 to be etched at a rate much faster than the selective overlayer 320 is etched. It will be recognized by those skilled in the art that this may be accomplished by choosing an appropriate etching chemistry having the necessary properties based on the composition of the selective overlayer 320 and the dielectric layer 310. By way of example only, if the selective overlayer is formed of SiN and the portion of the dielectric layer being etched is formed of $SiO_2$, the desired etching properties may be obtained using an etching chemistry comprising $C_4F_8$, CO, Ar and $O_2$.

Figure 3G:
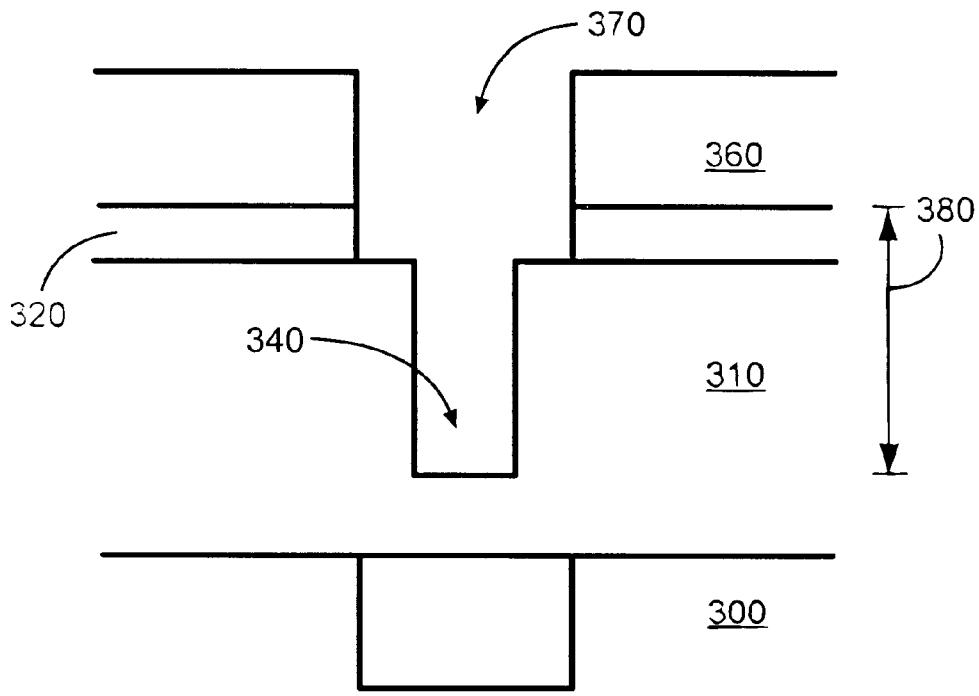

Referring to FIG. 3G, the selective overlayer 320 is etched using the second patterned photoresist layer 360 as a mask to transfer the second opening 370 substantially through the selective overlayer 320. The etching process may be performed using any of several well-known etching techniques such as HDP or reactive ion etching. The etching process should have a high degree of selectivity between the selective overlayer 320 and the second patterned photoresist layer 360 so that the second opening 370 can be transferred through the selective overlayer 320 while the second patterned photoresist layer 360 is etched minimally, if at all. It will be understood by those skilled in the art that this may be achieved by selecting an etching chemistry that etches the selective overlayer 320 at a much faster rate than the second patterned photoresist layer 360. By way of example only, if the selective overlayer 320 is formed of SiN and the second patterned photoresist layer 360 is formed of organic material, then an etching chemistry comprising $CH_3F$ and $O_2$ may be used.

Figure 3H:
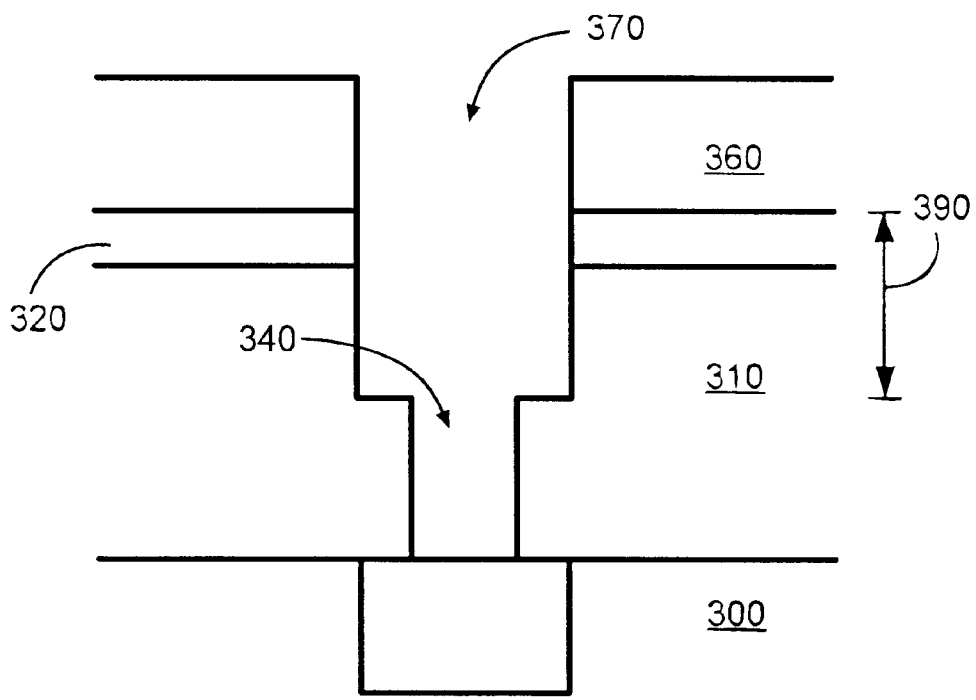

Referring now to FIG. 3H, the dielectric layer 310 is etched using the second patterned photoresist layer 360 as a mask to transfer the first opening 340 through the dielectric layer 310 exposing the underlying semiconductor substrate 300, while, at substantially the same time, the second opening 370 is transferred at least partially into the dielectric layer 310 to a third predetermined depth 390. The third predetermined depth 390 is chosen based on the desired depth of the second opening 370 as dictated by the overall circuit design. This may be accomplished using any of several well-known etching techniques whereby the etching chemistry is chosen such that the portion of the dielectric layer 310 being etched etches at a much faster rate than the selective overlayer 320. By way of example only, if the selective overlayer is made of SiN and the portion of the dielectric layer being etched is made of silicon oxide $SiO_2$, then an etching chemistry comprising $C_4F_8$, CO, Ar and $O_2$ may be used.

The second patterned photoresist layer 360 is then removed using any of several known techniques such as oxygen plasma ashing or applying a chemical solvent strip. It will be understood, however, that the second patterned photoresist layer may be removed prior to the etching step shown in FIG. 3H without altering the novel aspects of the invention.

Figure 3I:
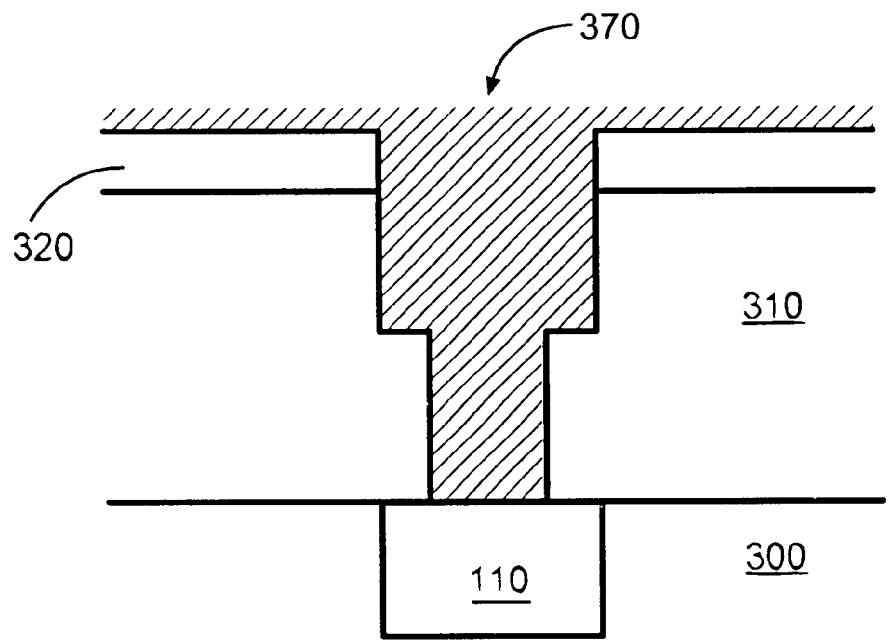
Figure 3J:
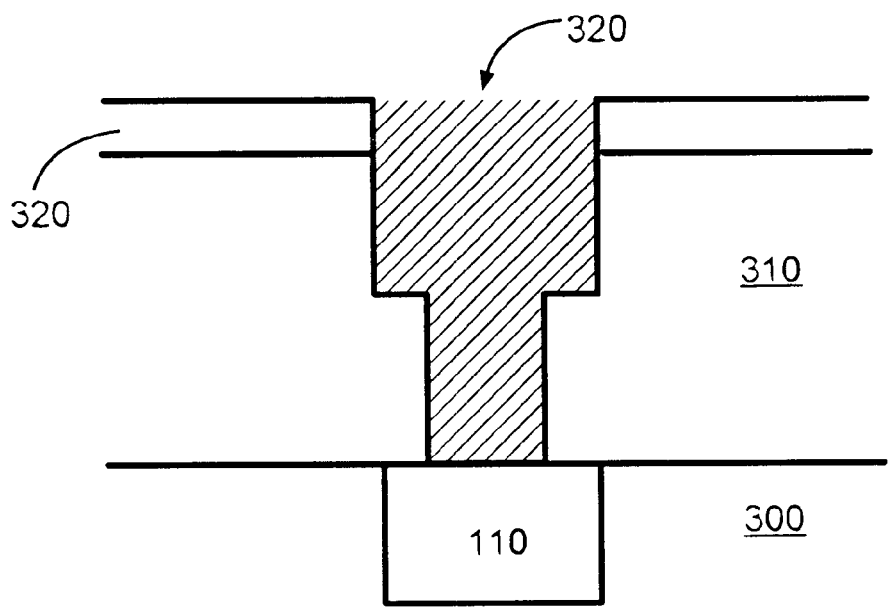

Turning now to FIG. 3I, a conductive layer 395, preferably comprising a metal such as copper, may be deposited to fill the first and second openings 340, 370 using techniques well known in the art. The completed dual damascene structure is then polished and planarized to remove unwanted portions of the conductive layer 395 extending past the dielectric layer using common techniques such as chemical/mechanical polishing (CMP). Advantageously, the selective overlayer 320 can serve as a polish slowdown during this process, which provides for greater control over the trench depth because a high degree of selectivity is obtainable between the selective overlayer and the conductive layer. The selective overlayer 320 also provides the advantage of preventing erosion of the dielectric layer 310 during the polishing process. The completed, planarized multilevel interconnect structure with the selective overlayer still intact is shown in FIG. 3J. If desired, the selective overlayer can be removed after the polishing and planarization process using well-known techniques leaving a conductive contact raised slightly above the dielectric layer.

Alternatively, if desired, the selective overlayer 320 can be removed prior to the deposition of the conductive layer 395 using common etching techniques. The conductive layer can then be deposited and polished to cause the conductive layer and the dielectric layer to be substantially coplanar using techniques well known in the art.

In accordance with the embodiment described at length above, the dielectric layer 310 may comprise a first dielectric layer comprising a first dielectric material formed over a second dielectric layer comprising a second dielectric material. Preferably the first and second dielectric layers are selected such that they share similar etching characteristics. In this embodiment, the selective overlayer 320 and the dielectric layer 310 are etched to the first predetermined depth 350 to transfer the first opening 340 at least partially into the first dielectric layer. It will be recognized, however, that the first opening may be transferred through the first dielectric layer and into one or more of the underlying dielectric layers, if desired. The dielectric layer 310 is then etched to the second predetermined depth 380 to transfer the first opening 340 through the first dielectric layer and at least partially into the second dielectric layer. The dielectric layer 310 is then etched using the selective overlayer as a mask to transfer the first opening 340 through the second dielectric layer while, at the same time, transferring the second opening 370 through the first dielectric layer.

Figure 4A:
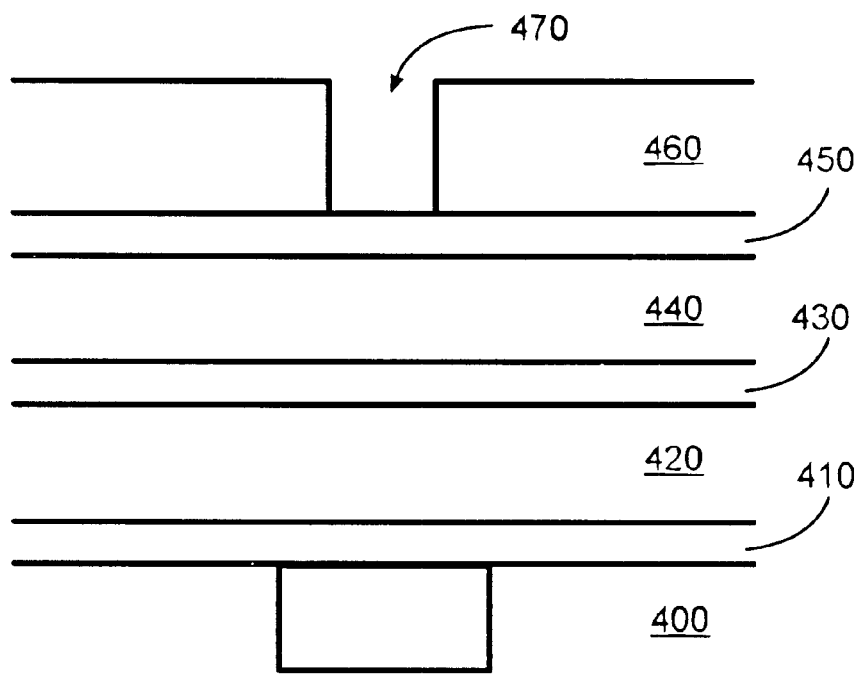
FIGS. 4A–4G are cross-sectional views showing manufacturing steps of another method for fabricating a multilevel conductive interconnection for an integrated circuit according to a second embodiment of the present invention.

Referring to FIGS. 4A–4G, there are shown cross-sectional views illustrating steps of another preferred embodiment of the present invention wherein the dielectric layer comprises a composite layer. Turning to FIG. 4A, a semiconductor substrate 400 is provided having a composite layer formed thereon, wherein the composite layer comprises a first dielectric layer 440, formed over a second dielectric layer 430, formed over a third dielectric layer 420, formed over a fourth dielectric layer 410.

The first dielectric layer 440 is sometimes referred to as the trench dielectric layer and may comprise $SiO_2$ or any of several dielectrics with similar properties. The second dielectric layer 430, sometimes referred to as the etch stop dielectric layer, may comprise SiN or any one of several materials with similar characteristics. The third dielectric layer 420, sometimes referred to as the via dielectric layer, may comprise $SiO_2$, but it will be understood by those skilled in the art that any dielectric material with similar properties may also be used. The fourth dielectric layer 410 serves as a diffusion barrier to protect the semiconductor substrate and may comprise any of a variety of materials such as SiN, SiON, or a—SiC:H. Each of the layers of dielectric may be formed using PECVD, CVD, spin-on techniques, or any of several other techniques well-known in the art.

Preferably, the first and third dielectric layers 440, 420 have similar etching characteristics while the second and fourth dielectric layers 430, 410 also have similar etching characteristics. It is also preferred that there be a high degree of selectivity between the second and fourth dielectric layers 430, 410 and the first and third dielectric layers 440, 420. By way of example only, the composite layer may comprise a first dielectric layer comprising $SiO_2$, a second dielectric layer comprising SiN, a third dielectric layer comprising $SiO_2$, and a fourth dielectric layer comprising SiN.

The thickness of each of the dielectric layers may vary depending on the design of the integrated circuit. In a preferred embodiment, the first and third dielectric layers 440, 420 may have a thickness between approximately 300 to 900 nanometers while the second and fourth dielectric layers 430, 410 may have a thickness between approximately 5 to 150 nanometers. In yet another preferred embodiment, the second and fourth dielectric layers 440, 420 have approximately the same thickness.

Referring to FIG. 4A, an aspect of the present invention is the formation of a selective overlayer 450 over the first dielectric layer 440. The selective overlayer 450 may comprise any of several materials well-known in the art and may be formed using PECVD, CVD, spin-on methods, or other techniques well-known in the art. In accordance with the present invention, the selective overlayer 450 should be chosen such that it has a high degree of selectivity with respect to the first and third dielectric layers 440, 420. The selectivity is preferably greater than the thickness of the first dielectric layer divided by the thickness of the selective overlayer. By way of example only, if the first and third dielectric layers 440, 420 comprise $SiO_2$, the selective overlayer 450 may comprise SiN, a—SiC:H, SiON, or any of several other materials with similar etching characteristics.

Next, still referring to FIG. 4A, a first patterned photoresist layer 460 is formed over the selective overlayer 450 to define a first opening 470 using any of several photolithography methods well-known in the art. The dimensions of the first opening 470 are determined based on the overall circuit design.

Figure 4B:
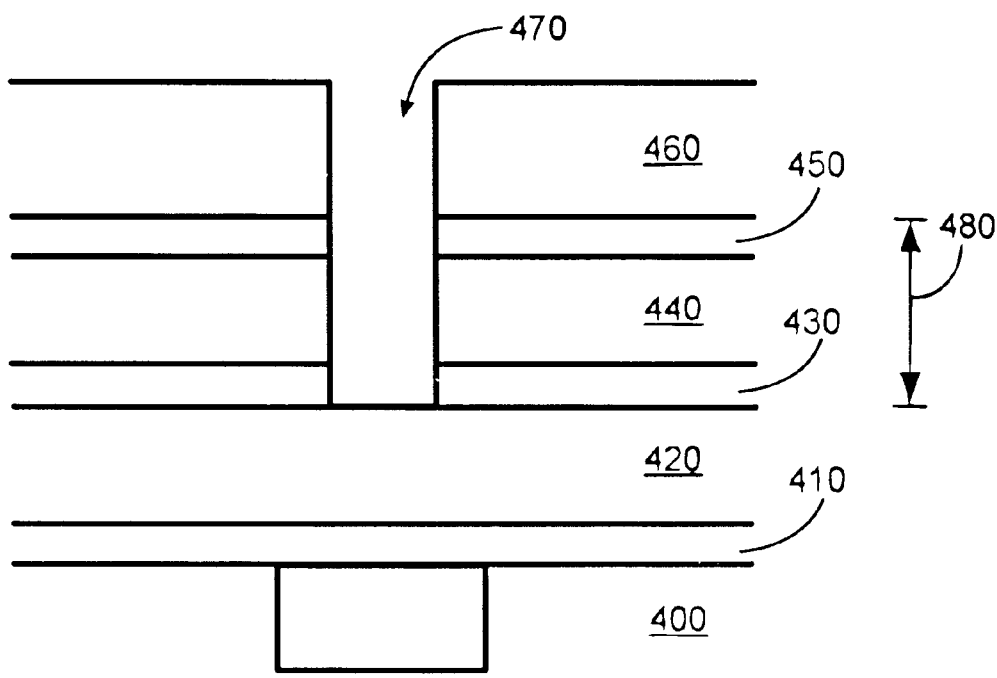

Turning to FIG. 4B, the selective overlayer 450 and the composite layer are etched to a first predetermined depth 480 using the first patterned photoresist layer 460 as a mask to transfer the first opening 470 through the selective overlayer 450 and into one or more of the dielectric layers of the composite layer. The etching process may be performed using any of several well-known etching techniques including reactive ion or HDP etching.

In accordance with the present invention, the first predetermined depth 480 should be shallow enough to prevent undeveloped photoresist from remaining in the bottom or lower portion of the first opening after completion of subsequent photolithography steps. It is preferred that the first opening 470 be transferred to a first predetermined depth 480 which is approximately the same as the depth of the upper boundary of the third dielectric layer 420.

Figure 4C:
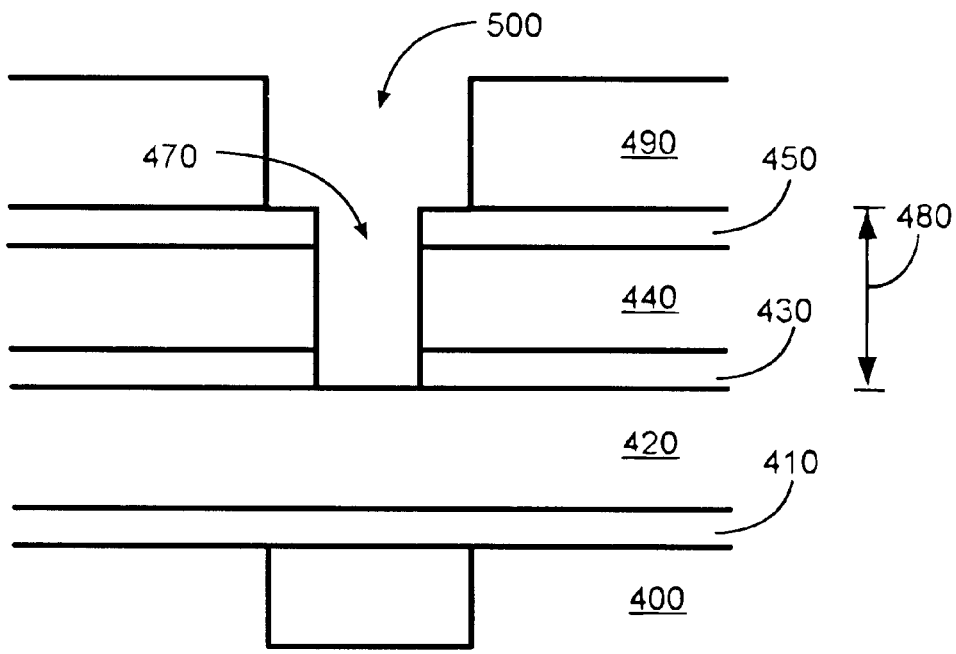

Referring to FIG. 4C, the first patterned photoresist layer is removed using any of several techniques well-known in the art such as oxygen plasma ashing or by applying a chemical solvent strip. Using well-known photolithography techniques, a second patterned photoresist layer 490 is formed over the selective overlayer 450 to define a second opening 500. The dimensions of the first and second openings 470, 500 are determined based on the overall circuit design. Thus, although the second opening 500 shown in FIG. 4C is wider than the first opening 470, this need not be the case depending on the requirements of the circuit design.

Figure 4D:
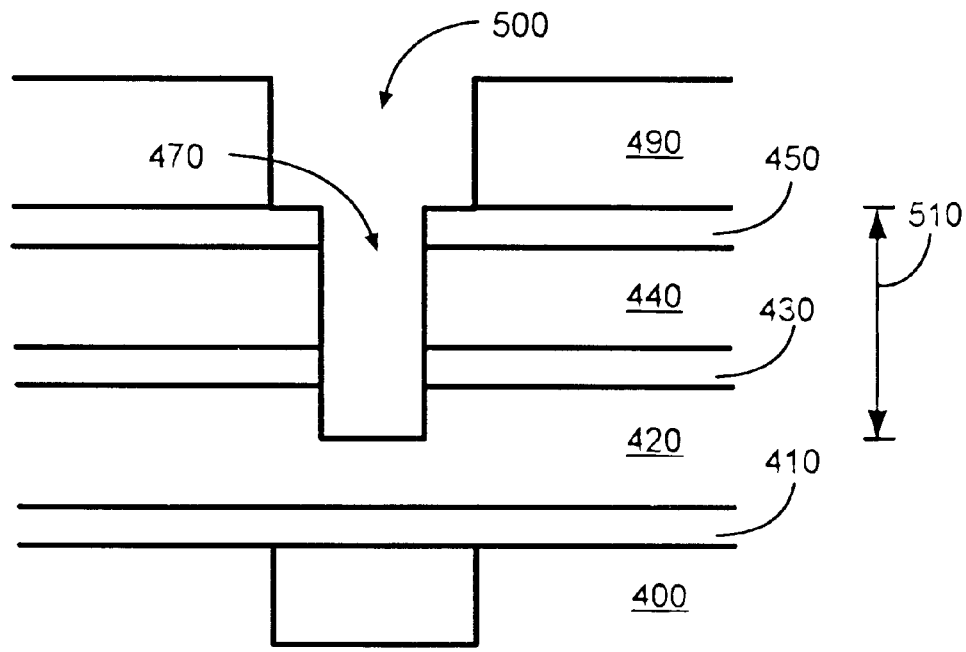

Turning to FIG. 4D, the composite layer is etched to a second predetermined depth 510 which is greater than the first predetermined depth 480 using the second patterned photoresist layer 490 and the selective overlayer 450 as masks to transfer the first opening 470 further into one or more of the dielectric layers of the composite layer. Advantageously, the selective overlayer 450 prevents the second opening 500 from being transferred into the first dielectric layer 440 while still allowing the first opening 470 to be transferred further into the composite layer. This allows a deep first opening to be formed without eroding the first dielectric layer 440 and eliminates the possibility that undesired undeveloped photoresist may remain at the bottom of the first opening 470 because the depth of the first opening 470 remained relatively shallow until after the second patterned photoresist layer 490 had been formed.

In a preferred embodiment of the invention, the composite layer is etched such that the second predetermined depth 510 is between the depth of an upper and lower boundary of the third dielectric layer 420. The second predetermined depth 510 preferably is chosen so that the first opening 470 may be transferred through the third dielectric layer 420 in substantially the same length of etch time as the second opening 500 is transferred through the second dielectric layer 440 in subsequent steps. This may be accomplished by choosing the second predetermined depth 510 such that the difference between the lower boundary of the first dielectric layer 440 and the second predetermined depth 510 is equal to the thickness of the first dielectric layer 440.

The etching process may be accomplished by choosing an etching chemistry such that the third dielectric layer 420 etches faster than the selective overlayer. By way of example, if the selective overlayer 450 is composed of SiN and the first and third dielectric layers 440, 420 are composed of $SiO_2$, then a suitable etching solution may comprise $C_4F_8$, CO, Ar and $O_2$.

Figure 4E:
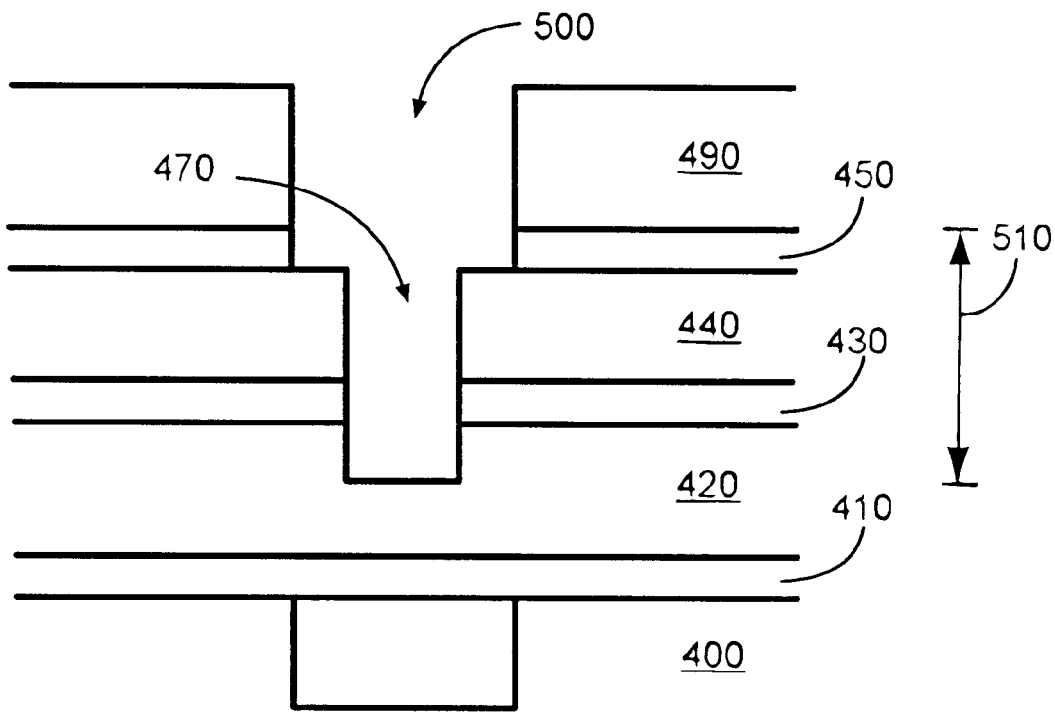

Turning now to FIG. 4E, the selective overlayer 450 is then etched using the second patterned photoresist layer 490 as a mask to transfer the second opening 500 through the selective overlayer 450. This etching step may be accomplished using any of several etching techniques known in the art, such as HDP etching, by selecting an etching chemistry such that the selective overlayer 450 is etched at a very high rate while the first and third dielectric layers 440, 420 are etched minimally, if at all. By way of example if the selective overlayer 450 is composed of SiN and the first and third dielectric layers 440, 420 are composed of $SiO_2$, then suitable etching chemistry could comprise $CH_3F$ and $O_2$.

Figure 4F:
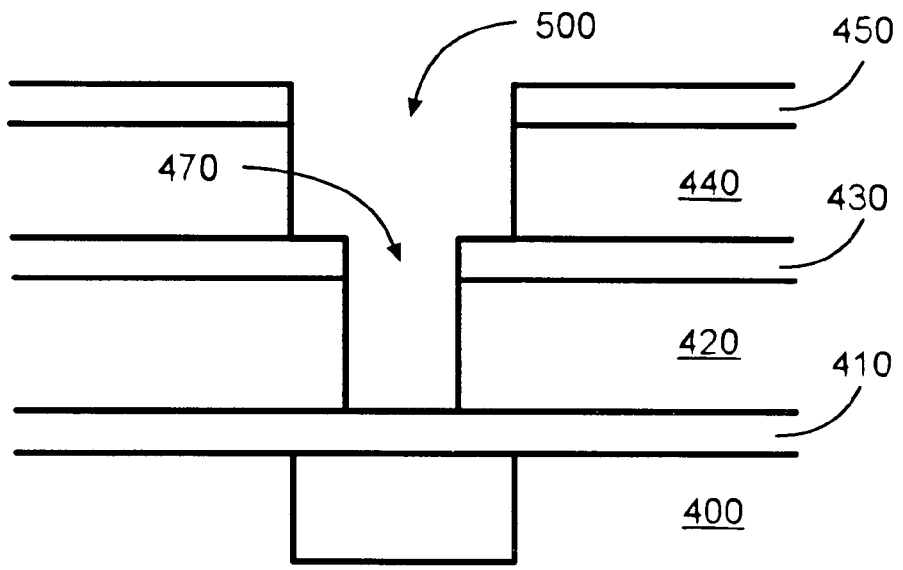

Referring to FIG. 4F, the composite layer is etched using the selective overlayer 450 and the second dielectric layer 430 as masks to transfer the first opening 470 substantially through the third dielectric layer 420 and the second opening 500 substantially through the first dielectric layer 440. This etching step may be accomplished using any of several etching techniques well-known in the art whereby the etching chemistry is chosen such that the first and third dielectric layers 440, 420 are etched at a much faster rate than the selective overlayer 450 and the second and fourth dielectric layers 430, 410. This allows the first opening 470 to be transferred through the third dielectric layer 420 and the second opening 500 to be transferred through the first dielectric layer 440 while the selective overlayer 450 and the second and fourth dielectric layers 430, 410 are etched minimally, if at all. This may be achieved using any of several well-known etching chemistries to provide the desired etch rates. By way of example, if the selective overlayer 450 and the second and fourth dielectric layers 430, 410 are each composed of SiN and the first and third dielectric layers 440, 420 are composed of $SiO_2$, then an etching chemistry comprising $C_4F_8$, CO, Ar and $O_2$ may be used.

Referring still to FIG. 4F, the second patterned photoresist layer 490 is removed using any of several techniques well-known in the art such as oxygen plasma ashing or by applying a chemical solvent strip. It will be recognized, however, that the second patterned photoresist layer may be removed after completion of the dual damascene opening without altering the novel aspects of the present invention as described below.

Figure 4G:
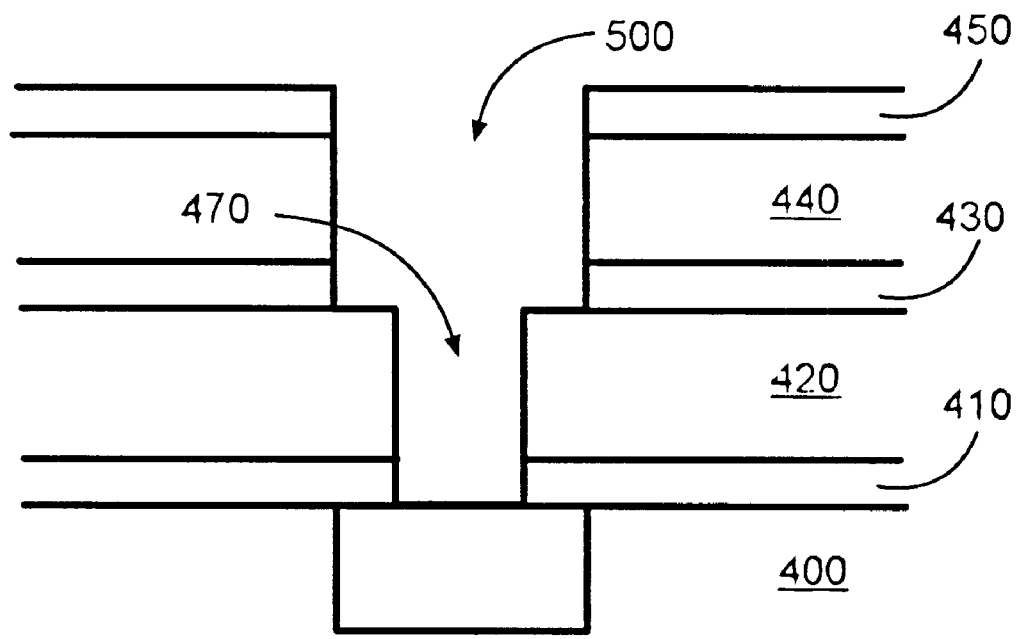

Turning now to FIG. 4G, the selective overlayer 450 and the composite layer are etched to transfer the first opening 470 substantially through the fourth dielectric layer 410 and the second opening 500 substantially through the second dielectric layer 430. Preferably, the selective overlayer 450, the second dielectric layer 430, and the fourth dielectric layer 410 are selected such that that the three layers may be simultaneously etched to substantially remove the selective overlayer 450 while, at substantially the same time, transferring the first opening 470 through the fourth dielectric layer 410 and the second opening 500 through the second dielectric layer 430. This may be accomplished by selecting the selective overlayer 450, the second dielectric layer 430, and the fourth dielectric layer 410 such that they share substantially the same thickness and substantially the same etching characteristics. Preferably, the selective overlayer 450 and the second and fourth dielectric layers 430, 410 are selected such that they are etched at a much faster rate than the first and third dielectric layers 440, 420. By way of example, the selective overlayer 450 and the second and fourth dielectric layers 430, 410 may each comprise SiN and the first and third dielectric layers 440, 420 may comprise $SiO_2$. In this embodiment, the etching step may be performed using an etching chemistry comprising $CH_3F$ and $O_2$.

It will be understood, however, that, even if the respective layers are of varied thickness or have varied etching characteristics, the same results may be still be achieved by altering either the thickness or the etching characteristics of the respective layers such that the time required to etch each layer remains substantially the same. By way of example only, the selective overlayer could be twice as thick as the second and fourth dielectric layers and still be removed in substantially the same amount of time if the etching chemistry were chosen such that the selective overlayer was etched at twice the rate of the second and fourth dielectric layers.

A conductive layer (not shown), preferably comprising a metal such as copper, is then deposited to fill the first and second openings. Having removed the selective overlayer 450, the excess metal may be polished away and the structure planarized to cause the conductive layer to be substantially coplanar with the first dielectric layer 440 using common techniques such as CMP.

Alternatively, in another preferred embodiment, the selective overlayer 450 is chosen such that the etch process removes all but a relatively thin layer of the selective overlayer 450 which remains over the first dielectric layer 440. A conductive layer is then applied as before. The excess metal is then polished away and the entire structure is planarized using common techniques such as CMP. Advantageously, the thin layer of the selective overlayer 450 may then serve as a polish slowdown during the polishing and planarization process as described in the above embodiments. The selective overlayer 450 also prevents erosion of the first dielectric layer 440. In addition, the thin layer of the selective overlayer 450 may be removed after the planarization and polishing process leaving a conductive contact raised slightly above the first dielectric layer 440.

In yet another preferred embodiment of the invention, the steps of the previous preferred embodiment are performed up to the stage depicted in FIG. 4E. Rather than removing the second patterned photoresist layer 490, the composite layer is etched using the second patterned photoresist layer 490 and the second dielectric layer 430 as masks to transfer to the first opening 470 through the fourth dielectric layer 410 and the second opening 500 through the second dielectric layer 430. In this preferred embodiment, the second patterned photoresist layer 490 serves as a mask over the selective overlayer 450 such that the selective overlayer 450 is left intact during the etching process. The second patterned photoresist layer 490 is then removed to expose the fully-intact selective overlayer 450. A conductive layer is then deposited as before and polished using the selective overlayer 450 as a polish slowdown. In addition to providing the advantages of the previous embodiment, this embodiment also allows the selective overlayer 450 to remain at approximately the same thickness throughout the formation of the dual damascene structure without requiring any additional etching. Thus, advantageously, the selective overlayer 450 may be formed to a desired thickness which is maintained throughout the process.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That to which is claimed:

1. A method of fabricating a multilevel conductive interconnection for an integrated circuit device, comprising:

providing a semiconductor substrate including a semiconductor device and having a dielectric layer formed thereon;

forming a selective overlayer over the dielectric layer;

forming a first patterned photoresist layer over the selective overlayer to define a first opening;

etching the selective overlayer and the dielectric layer to a first predetermined depth using the first patterned photoresist layer as a mask to transfer the first opening through the selective overlayer and at least partially into the dielectric layer;

removing the first patterned photoresist layer;

forming a second patterned photoresist layer over the selective overlayer to define a second opening;

etching the dielectric layer to a second predetermined depth, which is greater than the first predetermined depth, using the selective overlayer as a mask to transfer the first opening further into the dielectric layer;

etching the selective overlayer using the second patterned photoresist layer as a mask to transfer the second opening substantially through the selective overlayer; and etching the dielectric layer using the selective overlayer as a mask to transfer the first opening through the dielectric layer exposing the semiconductor substrate, and the second opening into the dielectric layer to a third predetermined depth which is less than the second predetermined depth.

2. The method of claim 1, further comprising:

removing the second patterned photoresist layer;

removing the selective overlayer;

depositing a conductive layer to fill the first and second openings; and polishing the conductive layer to cause the conductive layer and the dielectric layer to be substantially coplanar.

3. The method of claim 1, further comprising:

removing the second patterned photoresist layer;

depositing a conductive layer to fill the first and second openings; and polishing the conductive layer using the selective overlayer as a polish slowdown.

4. The method of claim 1, wherein providing the semiconductor substrate includes providing a semiconductor substrate having a dielectric layer formed thereon, wherein the dielectric layer comprises a first dielectric layer comprising a first dielectric material formed over a second dielectric layer comprising a second dielectric material.

5. The method of claim 4, wherein etching the selective overlayer and the dielectric layer to the first predetermined depth includes etching the dielectric layer to the first predetermined depth to transfer the first opening at least partially into the first dielectric layer.

6. The method of claim 4, wherein etching the dielectric layer to the second predetermined depth includes etching the dielectric layer to the second predetermined depth to transfer the first opening through the first dielectric layer and at least partially into the second dielectric layer.

7. The method of claim 4, wherein etching the dielectric layer using the selective overlayer as a mask to transfer the first opening through the dielectric layer includes etching the dielectric layer to the third predetermined depth to transfer the second opening substantially through the first dielectric layer.

8. The method of claim 1, wherein forming a selective overlayer includes forming a selective overlayer comprising one of silicon nitride, amorphous hydrogenated silicon carbide, and silicon oxynitride.

9. The method of claim 1, wherein forming a selective overlayer includes forming a selective overlayer with a thickness of approximately 5 to 150 nanometers.

10. A method of fabricating a multilevel conductive interconnection for an integrated circuit device, comprising:

providing a semiconductor substrate including a semiconductor device and having a composite layer formed thereon, wherein the composite layer comprises a first dielectric layer formed over a second dielectric layer formed over a third dielectric layer formed over a fourth dielectric layer;

forming a selective overlayer over the composite layer;

forming a first patterned photoresist layer over the selective overlayer to define a first opening therein;

etching the selective overlayer and the composite layer to a first predetermined depth using the first patterned photoresist layer as a mask to transfer the first opening through the selective overlayer and at least partially into the composite layer;

removing the first patterned photoresist layer;

forming a second patterned photoresist layer over the selective overlayer to define a second opening therein;

etching the composite layer to a second predetermined depth which is greater than the first predetermined depth using the selective overlayer as a mask to transfer the first opening further into the composite layer while the selective overlayer prevents the second opening from being transferred into the first dielectric layer;

etching the selective overlayer using the second patterned photoresist layer as a mask to transfer the second opening substantially through the selective overlayer;

etching the composite layer using the selective overlayer and the second dielectric layer as masks to transfer the first opening substantially through the third dielectric layer and the second opening substantially through the first dielectric layer; and etching the composite layer to transfer the first opening substantially through the fourth dielectric layer and the second opening substantially through second dielectric layer.

11. The method of claim 10, wherein providing a semiconductor substrate having a composite layer deposited thereon includes providing a semiconductor substrate having a composite layer comprising a second dielectric layer and a fourth dielectric layer having a thickness between approximately 5 to 150 nanometers.

12. The method of claim 10, wherein providing a semiconductor substrate having a composite layer deposited thereon includes providing a semiconductor substrate having a composite layer comprising a first dielectric layer and a second dielectric layer having a thickness between approximately 300 to 900 nanometers.

13. The method of claim 10, wherein forming a selective overlayer includes forming a selective overlayer comprising one of silicon nitride, amorphous hydrogenated silicon carbide, and silicon oxynitride.

14. The method of claim 10, wherein forming a selective overlayer over the composite layer includes forming a selective overlayer having a thickness between approximately 5 to 150 nanometers.

15. The method of claim 10, wherein etching the selective overlayer and the composite layer to a first predetermined depth includes etching the composite layer to a first predetermined depth to expose the third dielectric layer.

16. The method of claim 10, wherein etching the composite layer to a second predetermined depth includes etching the composite layer to a second predetermined depth to transfer the first opening at least partially into the third dielectric layer.

17. The method of claim 10, further comprising:

removing the second patterned photoresist layer to expose the selective overlayer;

depositing a conductive layer to fill the first and second openings; and polishing the conductive layer using the selective overlayer as a polish slowdown.

18. The method of claim 10, wherein etching the composite layer to transfer the first opening substantially through the fourth dielectric layer and the second opening substantially through the second dielectric layer is preceded by removing the second patterned photoresist layer to expose the selective overlayer.

19. The method of claim 18, wherein the step of etching the composite layer to transfer the first opening substantially through the fourth dielectric layer and the second opening substantially through second dielectric layer includes etching the selective overlayer to substantially remove the selective overlayer.

20. The method of claim 19, further comprising:

depositing a conductive layer to fill the first and second openings; and polishing the conductive layer to cause the conductive layer and the composite layer to be substantially coplanar.

21. A method of fabricating a relatively deep partial via in a multilevel conductive interconnection fabrication process, comprising:

provinding a semiconductor substrate including a semiconductor device and having a dielectric layer formed thereon;

forming a selective overlayer over the dielectric layer;

forming a first patterned photoresist layer over the selective overlayer to define a first opening;

etching the selective overlayer and the dielectric layer to a first predetermined depth using the first patterned photoresist layer as a mask to transfer the first opening through the selective overlayer and at least partially into the dielectric layer;

removing the first patterned photoresist layer;

forming a second patterned photoresist layer over the selective overlayer to define a second opening;

etching the dielectric layer to a second predetermined depth, which is greater than the first predetermined depth, using the selective overlayer as a mask to transfer the first opening further into the dielectric layer; and etching the selective overlayer using the second patterned photoresist layer as a mask to transfer the second opening substantially through the selective overlayer.

* * * * *